(12) United States Patent
Dimroth et al.

(10) Patent No.: US 9,306,104 B2
(45) Date of Patent: Apr. 5, 2016

(54) PHOTOVOLTAIC CONCENTRATOR MODULE WITH MULTIFUNCTION FRAME

(75) Inventors: Frank Dimroth, Freiburg (DE); Andreas Bett, Freiburg (DE); Christoph Schmidt, Gunzenhausen (DE); Hansjörg Lerchen-Müller, Freiburg (DE)

(73) Assignee: SOITEC SOLAR GMBH, Freiburg Im Breisgau (DE)

( * ) Notice: Subject to any disclaimer, the term of this patent is extended or adjusted under 35 U.S.C. 154(b) by 1839 days.

(21) Appl. No.: 12/279,159

(22) PCT Filed: Feb. 15, 2007

(86) PCT No.: PCT/EP2007/001326
§ 371 (c)(1),
(2), (4) Date: Oct. 3, 2008

(87) PCT Pub. No.: WO2007/093422
PCT Pub. Date: Aug. 23, 2007

(65) Prior Publication Data
US 2009/0126794 A1    May 21, 2009

(30) Foreign Application Priority Data
Feb. 17, 2006  (DE) .......................... 10 2006 007 472

(51) Int. Cl.
*H01L 31/00*     (2006.01)
*H01L 31/054*    (2014.01)
(Continued)

(52) U.S. Cl.
CPC .......... *H01L 31/0543* (2014.12); *H01L 31/048* (2013.01); *H01L 31/052* (2013.01); *H01L 31/0522* (2013.01); *H01L 31/0524* (2013.01);
(Continued)

(58) Field of Classification Search
CPC .............. H01L 31/052; H01L 31/0522; H01L 31/0524; H01L 31/048; Y02E 10/52; H02S 20/00
USPC .......................... 136/243, 244, 251; 52/173.3
See application file for complete search history.

(56) References Cited

U.S. PATENT DOCUMENTS 4,834,805 A   5/1989  Erbert
5,213,627 A   5/1993  Marquardt
(Continued)

FOREIGN PATENT DOCUMENTS

DE    4131393 A1    5/1992
DE    4140682 A1    6/1993
(Continued)

OTHER PUBLICATIONS

International Preliminary Report on Patentability and Written Opinion for corresponding Patent Application PCT/EP2007/001326.
(Continued)

*Primary Examiner* — Matthew Martin
(74) *Attorney, Agent, or Firm* — Matthew B. Dernier, Esq.

(57) ABSTRACT

The invention relates to a photovoltaic concentrator module with multifunction frame and also to a method for production thereof. The concentrator module has a lens- and a base plate, between which a frame extends. Between the lens plate and the frame and/or the base plate and the frame, two sealing compounds and/or adhesive compounds extend, which compounds differ with respect to their hardening time and/or gas permeability.

58 Claims, 4 Drawing Sheets

(51) Int. Cl.
    *H01L 31/048* (2014.01)
    *H01L 31/052* (2014.01)
    *H02S 40/20* (2014.01)
    *H02S 30/10* (2014.01)
    *H01L 31/042* (2014.01)

(52) U.S. Cl.
    CPC ............... *H02S 20/00* (2013.01); *H02S 30/10* (2014.12); *H02S 40/20* (2014.12); *Y02E 10/52* (2013.01)

(56) References Cited

U.S. PATENT DOCUMENTS

| | | | |
|---|---|---|---|
| 5,273,593 A * | 12/1993 | Marquardt et al. | 136/251 |
| 5,409,550 A | 4/1995 | Safir | |
| 5,460,660 A | 10/1995 | Albright | |
| 5,730,770 A * | 3/1998 | Greisz | 55/385.6 |
| 6,462,266 B1 * | 10/2002 | Kurth | 136/251 |
| 6,709,750 B1 | 3/2004 | Poehlmann | |
| 7,019,207 B2 | 3/2006 | Harneit | |
| 2003/0000564 A1 * | 1/2003 | Shingleton et al. | 136/244 |
| 2003/0034063 A1 * | 2/2003 | Winston et al. | 136/246 |
| 2003/0116185 A1 | 6/2003 | Oswald | |
| 2003/0121542 A1 | 7/2003 | Harneit | |
| 2005/0034754 A1 | 2/2005 | Schmidt | |
| 2006/0150561 A1 * | 7/2006 | Van Klompenburg et al. | 52/633 |
| 2007/0044830 A1 * | 3/2007 | Uemura | 136/251 |

FOREIGN PATENT DOCUMENTS

| | | | | |
|---|---|---|---|---|
| DE | 19824965 A1 | 12/1999 | | |
| DE | 10048034 A1 | 5/2002 | | |
| EP | 0199233 | 10/1986 | | |
| EP | 896371 A * | 8/1996 | | H01L 31/048 |
| EP | 1191605 A2 | 3/2002 | | |
| WO | 9213362 A | 8/1992 | | |
| WO | 0046860 | 8/2000 | | |
| WO | 0175976 A | 10/2001 | | |
| WO | 03028114 A2 | 4/2003 | | |

OTHER PUBLICATIONS

International Search Report and Written Opinion for corresponding Patent Application PCT/EP2007/001326.

"Flatcon Concentrator PV-Technology Ready for the Market" by: A.W. Bett, et. al., Fraunhofer Institute for Solar Energy Systems ISE, 20th European Photovoltaic Solar Energy Conference, p. 114-117, Barcelona, Jun. 6-10, 2005.

German Office Action with English translation for DE102006007472.6-33 dated: Oct. 18, 2006.

* cited by examiner

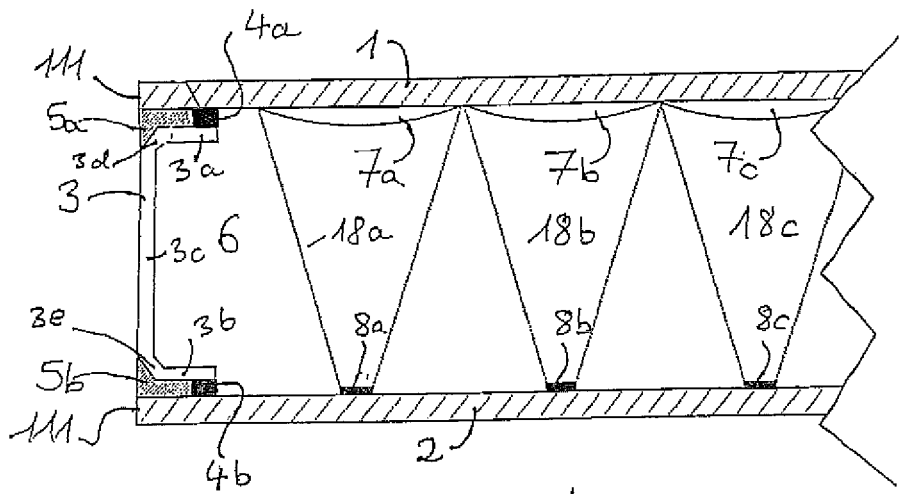
Figur 1
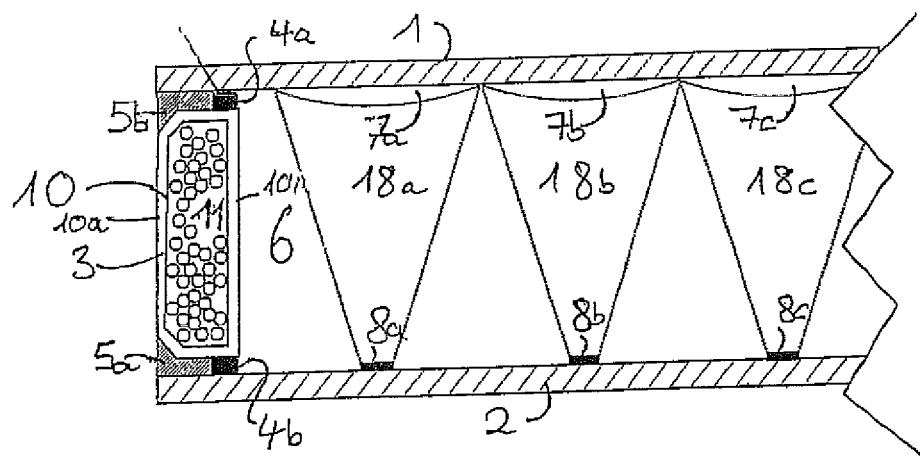
Figur 2
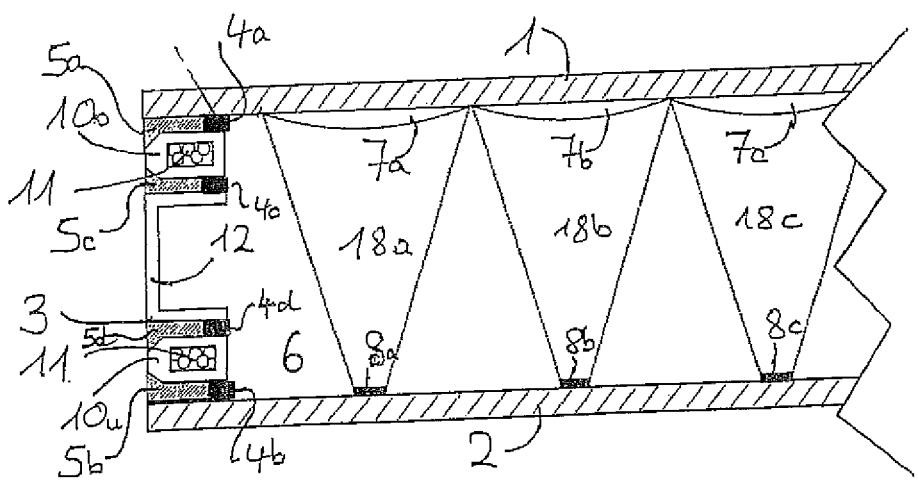
Figur 3

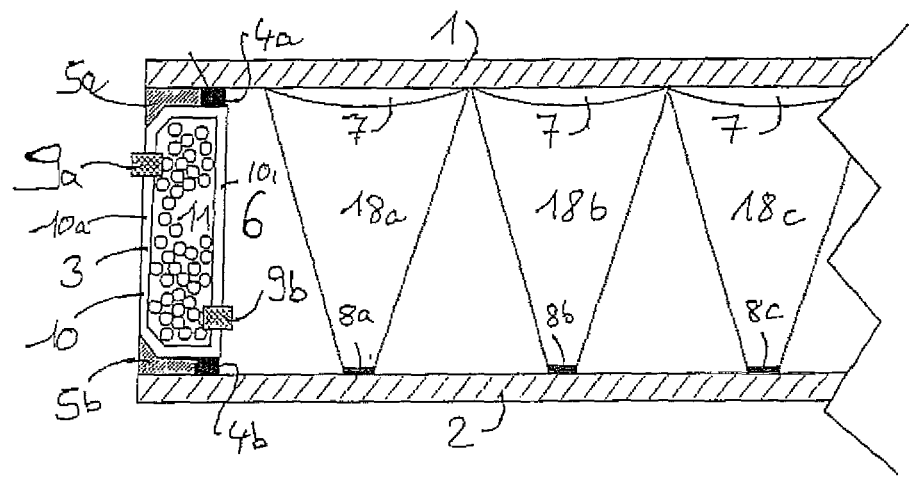
Figur 4
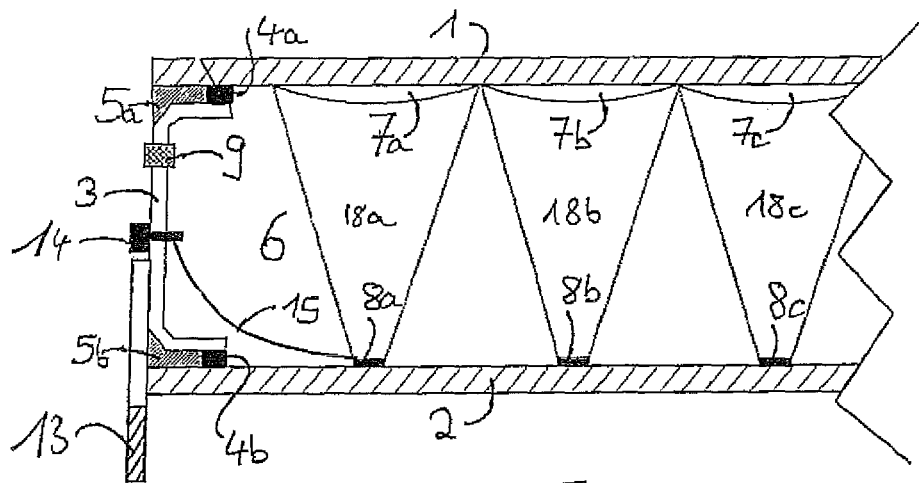
Figur 5
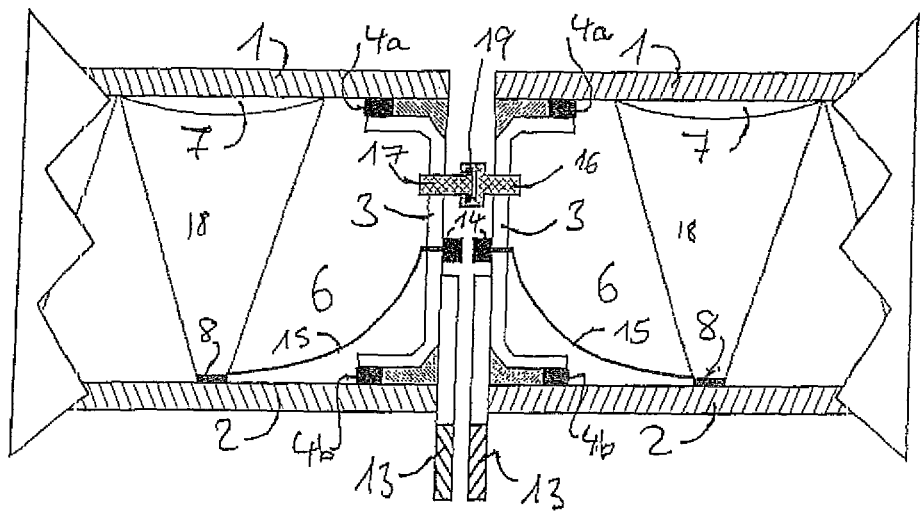
Figur 10

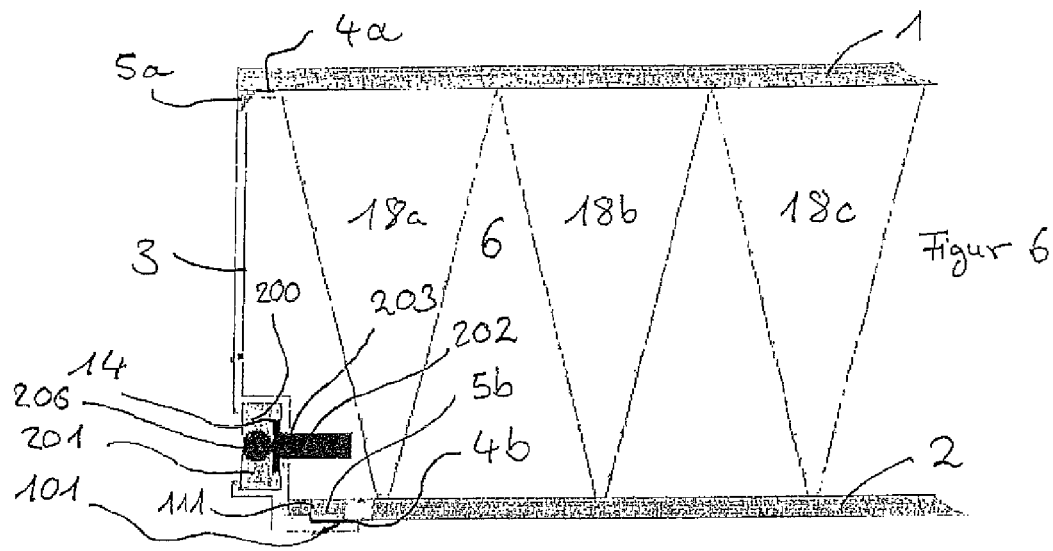
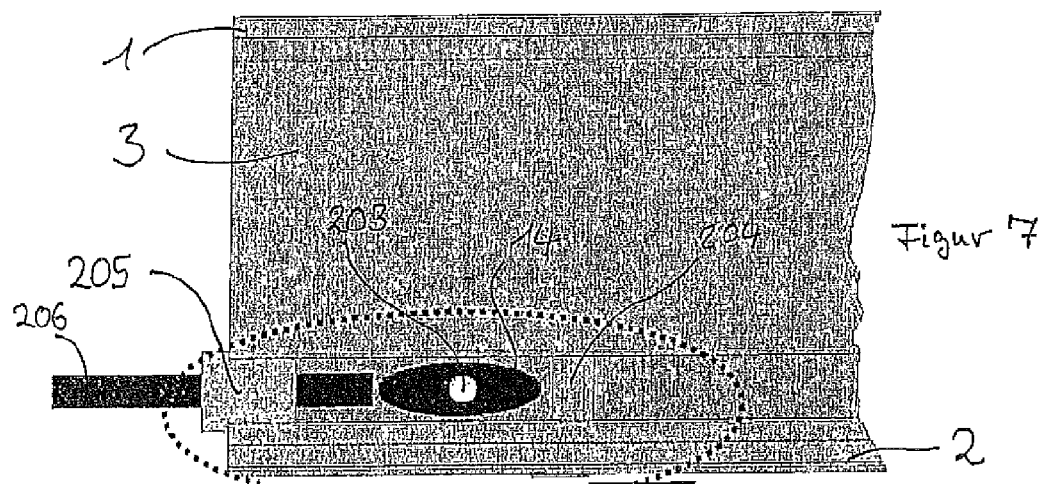
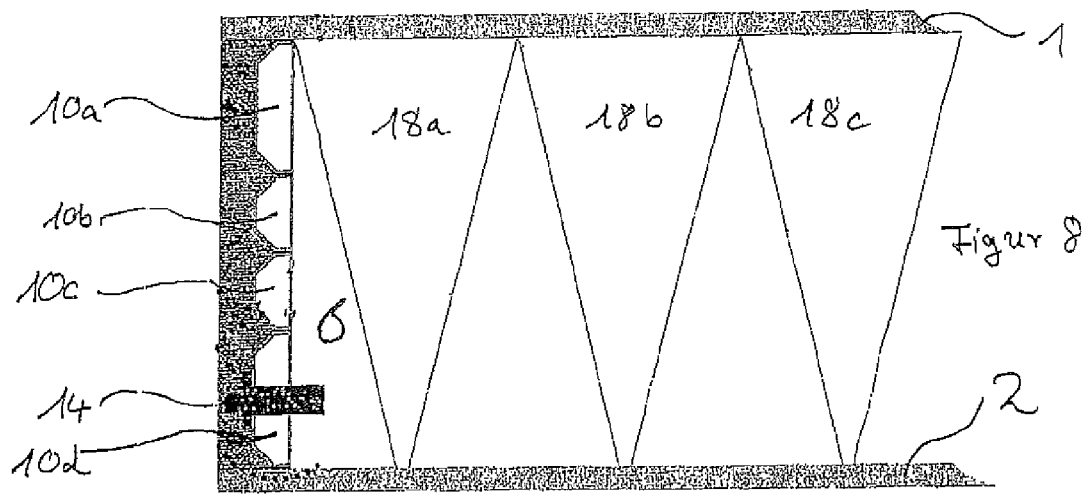

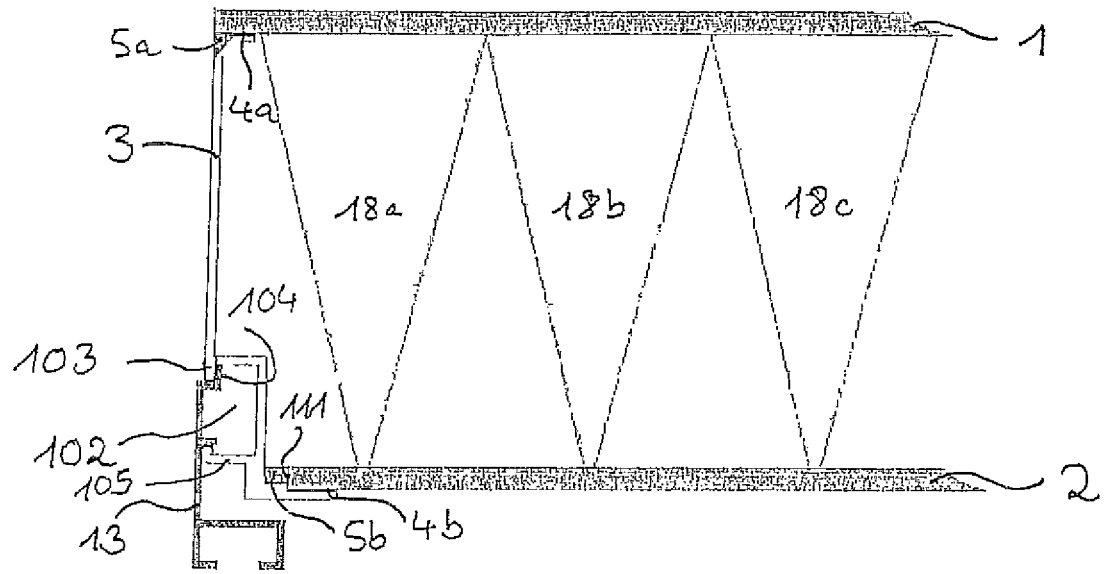
Figur 9
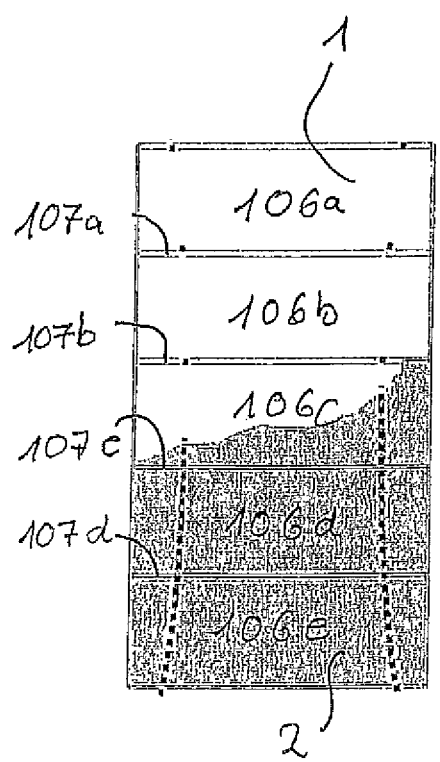
Figur 11
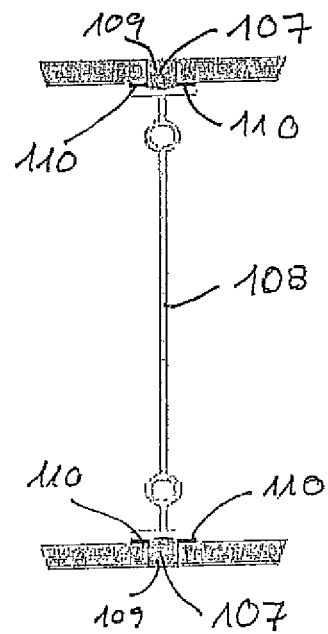
Figur 12

PHOTOVOLTAIC CONCENTRATOR MODULE WITH MULTIFUNCTION FRAME

BACKGROUND

The invention relates to a photovoltaic concentrator module with multifunction frame and also to a method for production thereof. Concentrator modules of this type are used in particular in the field of concentrating solar technology.

In photovoltaics, there have been approaches made already for many years to operate with concentrated solar radiation. The principle is simple: solar radiation is concentrated with mirrors and/or lenses and directed onto special concentrator solar cells. The required surface area of expensive cell material is hence reduced. A crucial breakthrough in concentrator technology is now imminent. This is the case not least because, with highly efficient concentrator PV solar cells on a III-V basis, efficiencies of the cells of over 37% have been achieved and hence efficiencies in the modules of significantly above 25% are possible. The application of III-V solar cells in concentrator systems has been investigated for a long time. Sunlight is hereby focused with the help of Fresnel lenses by a factor 300 to 1,000 on a tiny focal spot in which then a small solar cell of still merely 2 to 10 $mm^2$ is situated. The object of this procedure is to replace the expensive semiconductor surface of the III-V stacked cells for a comparatively economical lens system and consequently to make the application of this successful space technology also profitable on the ground.

Such concentrating photovoltaic systems serve for current generation, in particular in photovoltaic power plants. A large number of modules are mounted for this purpose on a tracking unit, a so-called tracker, which orientates the concentrator modules constantly towards the sun. The modules on a tracker are connected to each other electrically. This technology which is still very new has the advantages in the case of large-area use in particular, by enabling a cost reduction in photovoltaic current generation due to a high efficiency potential, of being able to be scaled into the gigawatt range without a shortage of raw materials and of having a short energy amortisation time.

Because of the higher complexity of concentrating photovoltaic systems in comparison with conventional flat modules, the former are suitable in particular for use in the power plant field. A certain amount of maintenance is required because of the controlled tracking and possible soiling of the lens system.

SUMMARY OF THE INVENTION

The present invention relates to a photovoltaic concentrator module for current generation which is constructed from two planes. On the upper plane, subsequently termed lens plate, an optical concentrator is situated, which preferably contains an arrangement of point-focusing lenses in the plane of the lens plate, preferably in such a form that the lenses cover as large a part as possible of the surface of the concentrator. Fresnel lenses, but also spherical lenses, are possible as lenses.

On the lower plane, subsequently termed base plate, the solar cells including the electrical wiring thereof are situated. Each solar cell is disposed in the focus respectively of one lens.

It is essential in the construction of these concentrator modules that the spacing of the lens plane from the base plate is maintained very precisely so that the concentrating light impinges completely on the surface of the solar cell.

A typical concentrator is the FLATCON® concentrator with a lens plate with Fresnel lenses which concentrate the sunlight by a geometric factor of 500 onto stacked cells with 2-3 pn junctions of III-V semiconductors.

The components of the lens plate and of the base plate are carried respectively preferably by a glass plate, however other plate materials, such as for example acrylic or Plexiglass, are also possible. The two glass plates are glued according to the previous procedure by four rectangular glass plates with silicon or UV-hardening adhesive in such a manner that the four glass plates form a frame which extends round at the edge of the lens- and base plate or they are screwed together with metal profiles which extend round at the edge of the lens- and base plate.

This procedure has several disadvantages: the sealing surface is very small and has been glued merely with a single sealing compound made of silicon. Consequently, it is not possible to keep the module sealed over periods of time of 20 years and more, against the ingress of moisture from outside. This is very problematic since moisture can lead to corrosion of contacts on and between the solar cells and consequently impairs the durability of this product. The manufacture of such glass frames from a plurality of individual parts is economically very unfavourable and can only be automated with difficulty. Finally, the additional components indicated in this invention, such as filters for active ventilation, sorption agents, module mounting and electrical leadthrough, can be achieved in a glass frame only with difficulty or not at all.

It is therefore the object of the present invention to produce a photovoltaic concentrator module which can be produced economically, is durable and which makes it possible to integrate simply and flexibly additional components which cannot be accommodated on the lens plate or the base plate or only with difficulty. Furthermore, a method is intended to be developed which enables the production of such concentrator modules.

The photovoltaic concentrator module according to the invention contains, as essential components, a lens plate, a base plate which is parallel to the lens plate, a frame which extends along the edge of the lens plate and of the base plate between the lens plate and the base plate, and also a first sealing compound and/or adhesive compound and a second sealing compound which are disposed adjacently extending at least partially along the frame between the lens plate and the frame and/or between the base plate and the frame, the two sealing and/or adhesive compounds differing with respect to their hardening times and/or gas permeabilities. Preferably, at least the second sealing compound forms a sealing line, but each sealing compound can in principle be configured as sealing line. The lens plate is hereby a transparent plate, for example made of glass, acrylic or Plexiglass on which at least one optical concentrator is disposed. The optical concentrator preferably contains point-focusing lenses, such as for example Fresnel lenses or spherical lenses.

This arrangement makes it possible to maintain the spacing between lens- and base plate very precisely so that it is ensured that the solar cells are illuminated completely by light focused by the lenses.

The base plate carries the solar cells and also parts of the wiring thereof, the module according to the invention being suitable above all for use with stacked cells.

At least one of the two sealing compounds which extend adjacently at least partially around as sealing lines parallel to the edge of the lens plate and/or of the base plate, is preferably permanently elastic. For the outer of these sealing compounds, an elastic silicone is suitable in particular, which is suitable for absorbing stresses and deformations of the different materials. The inner sealing compound is preferably a butyl cord which enables the air- and/or moisture-impermeable connection of the components of the concentrator module and fixing of the plates.

If for example mechanical stresses due to a different arrangement of the components of the module according to the invention occur on the inner sealing compound, then the inner sealing compound can also contain or consist of silicone and the outer sealing compound can be or consist of butyl cord.

Preferably, the second sealing compound, which contains for example silicone, extends next to the first sealing compound or adhesive compound. Hot-melt adhesive and/or UV-hardening adhesive are for example possible as adhesive compound. According to the invention, also merely a first sealing compound or a first adhesive compound can be used in portions.

The sealing compounds and/or adhesive compounds can be disposed extending around parallel to each other in the plane of the lens plate and/or the base plate. However also one or more sealing compounds for example can be accommodated between the edge of the lens plate and/or of the base plate and the frame. There are termed here as edge of the lens plate or base plate those sides of the lens- or base plate which delimit the respective plate between the surface which carries the lenses or the solar cells and the other side which is disposed respectively parallel thereto.

The frame of the concentrator module delimits the space containing the solar cells, subsequently termed the inside of the concentrator module or interior, from the exterior. Consequently, the solar cells can be protected permanently from moisture, dust, dirt and other environmental influences. The totality of all the components which connect lens- and base plate at the edge thereof in the above-described manner is termed frame.

Advantageously, the surfaces of the frame which abut against the lens plate and/or the base plate, such as for example the edge of the frame, are wide enough in order to receive at least two sealing lines comprising sealing compounds and/or adhesive compound.

The frame can be accommodated according to the invention completely between lens- and base plate. However, also parts of the frame or the entire frame can protrude beyond lens plate and/or base plate. On the other hand, the frame can however also be produced according to the invention such that it engages around the edge of the lens plate and/or the edge of the base plate so that the connection between the corresponding plate and the frame is produced on the side of the corresponding plate which is orientated towards the exterior of the module. In this case, a spacing can be produced between the edge of the lens plate and/or the base plate and the inside of the frame, which spacing can but need not be filled according to the invention with at least one sealing compound completely or partially on at least a part of the length of the frame. In particular, if the frame engages around the plates, a single sealing compound or an adhesive compound can be accommodated at the connection place between frame and the respective plate, which is orientated towards the exterior, whereas the other sealing compound is then accommodated, as described above, between the edge of the plate and the frame. Productions of one of the above-mentioned constructions of the frame in portions are also within the scope of the invention.

The frame can consist of according to the invention entirely or partially hollow profiles which can be empty or filled with sorption agent, there being possible inter alia as sorption agent $SiO_2$, silica gel, calcium chloride, calcium fluoride, magnesium sulphate, sodium sulphate and/or calcinated alumina.

These hollow profiles can thereby be of any shape. They can for example fill the entire width of the frame, i.e. the entire spacing between lens plate and base plate. However they can also fill only a part of the width of the frame, the remainder of the width being formed by spacer frames. These spacer frames are disposed between the hollow profiles and also between the hollow profiles and the lens plate or the base plate such that the frame, consisting of one or more hollow profiles and spacer frames, extends at least over the entire spacing between lens plate and base plate.

The frame can however also consist of one or more hollow profiles only along a part of its length. There may be understood here by the length of the frame, as in the following, its extension parallel to the edge of lens plate or base plate.

According to the invention, a frame which contains one or more hollow profiles over a part of its length on a part of its width or on its entire width is also possible, the resulting remainder of the width of the frame then being formed by one or more spacer frames. On portions of the frame length which have no hollow profiles, the frame consists of a spacer frame on its entire width.

Advantageously, the spacer frames and/or hollow profiles are produced such that their edge faces which are situated in the plane of the frame are sufficiently wide to provide room for the at least two sealing compounds and/or adhesive compounds in order to enable sealing of the module. There are possible here all different combinations of sealing compounds and adhesive compounds and also individual use thereof. The sealing and/or adhesive compounds extend preferably along the connection place of the hollow profiles with other hollow profiles, the frame, the spacer, the lens plate or the base plate. In principle, all connection places between the individual elements of the module can be sealed with sealing and/or adhesive compounds individually or adjacently.

In a further advantageous embodiment of the invention, the frame and/or at least one hollow profile and/or at least one spacer frame is provided with one or more openings. These openings can be accommodated on the side of hollow profiles which are orientated towards the interior of the module, subsequently termed inside, or on the side which is orientated towards the exterior, subsequently termed outside.

As simple holes in the inside, they serve for conveying away moisture into the interior of the hollow profile where the moisture can be absorbed by the one or more sorption agents.

The openings can also serve at each of the above-mentioned positions for the purpose of integrating further components in the concentrator module. According to the invention, one or more filters can be accommodated in suitably configured openings such that they fill the respective opening completely and enable controlled exchange of air or other gases between the interior and exterior. The filters can thereby contain or comprise for example a sintered metal and/or a metal grating and/or a plastic material net and/or a plastic material membrane. An arrangement of filters according to the preceding description may be mentioned in particular, in which one or more filters are accommodated in the inside of a hollow profile and one or more filters in the outside of the same hollow profile so that air or a different gas can flow through the filters and the hollow profile into the interior of the module or out of the module. In this way, a pressure equalisation between interior and exterior can be achieved, by means of which buckling of the lens plate and/or of the base plate is prevented during heating of the module. The inflowing air can thereby be dried by means of the sorption agent in the hollow profile so that the ingress of moisture into the concentrator module is avoided. Advantageously, coarser structures are chosen for the outer filters and finer structures for the inner ones. For example, the outer filter can be designed to exclude particles which are larger than 50 μm. The finer, inner filter could let for example particles up to a size of 5 μm pass through.

The process of gas exchange with the exterior can be controlled by targeted heating of at least parts of the concentrator module. Heating at the suitable point in time can take place according to the invention by means of a light-absorbing colouration of a part of the concentrator module so that, with sun irradiation commencing, air flows out of the concentrator module and, with the absence of sun irradiation, air dried by the sorption agent flows into the interior.

According to the invention, one or more connection elements can also be integrated in the frame of the module, said connection elements enabling the mechanical connection of the concentrator module to other modules. These connection elements can also be produced to be put together and/or accommodated in one or more of the above-described openings in the frame.

The connection elements can be produced to be gas-permeable so that externally dried air or another gas can be introduced into the interior of the module. A plurality of modules of the type described here can also be connected to each other via such a connection so that externally dried air can be conducted through the entire system of concentrator modules.

In a further embodiment of the module according to the invention, an electrical leadthrough, preferably moisture- and/or gas-impermeable, is integrated in the frame. A simple embodiment is described in the patent specification WO 03/028114. This electrical leadthrough can be connected by a wire for example in the interior to the solar cells and then serves for electrical wiring of the solar cells with devices in the exterior.

The frame can serve furthermore for mounting of devices which assist operation of the solar cell module by itself or in conjunction with other modules. Thus a mounting for example can be welded onto the frame or screwed on, with which the solar cell module for example can be mounted on a tracker and/or adjusted. The mounting can have a screw connection. However it can also be configured in such a manner that it permits the rapid connection of modules for example by managing. The mounting can contain in addition electrically conductive components so that it enables earthing of the concentrator module.

There are suitable as material for the frame, the hollow profiles and the spacer frame, steel, zinc-plated steel, stainless steel, aluminium and/or other metals and also composite materials, Plexiglass, polymethylmethacrylate (PMMA), acrylic glass, other plastic materials and glass. The materials can be used alone or in combination.

In an advantageous embodiment of the invention, the interior of the concentrator module has spacers which connect the lens plate and the base plate to each other. These spacers can have any shape. For example, the spacers placed between the lens- and base plate can be cylinders or cubes. However, a shape (termed double-T shape) is particularly advantageous, which has two parallel portions in cross-section, which are connected to each other via a third portion in the centre thereof. The two parallel portions thereby abut against the lens- or base plate.

In a further embodiment of the module according to the invention, the lens plate and/or the base plate can comprise a plurality of neighbouring partial plates which are situated in one plane. This enables the production of large modules with a large number of lens- and base plates, the size of which exceeds the technically achievable size of one individual lens- or base plate. Between the edges of the partial plates, a boundary region can thereby be produced which extends in the direction of the edges of the respective partial surfaces. Since this boundary region represents a spacing between the partial plates, it can serve for the purpose of taking up mechanical loads on the respective plate. For this purpose, it is advantageously filled with a sealing compound, containing or consisting of for example elastic silicone. Expediently, among at least a part of the resulting boundary regions between partial plates, spacers are fitted between lens- and base plate over a part of their length. The spacers can thereby have, in their cross-section perpendicular to the longitudinal extension of the boundary region, the above-described double-T shape, so that the spacer per se is relatively narrow but contributes a broad surface to the boundary region. On this relatively broad surface, at least one sealing compound and/or adhesive compound can be accommodated between the spacer and the lens- or base plate along each side of the boundary region, so that the interior of the module is sealed against the exterior.

In the method according to the invention for the production of the photovoltaic concentrator module, lens plate and base plate are pressed together in such a manner that the spacing between the lens plate and the base plate is maintained with a tolerance <1 mm, preferably <500 μm. For this purpose, a spacer can be placed between lens plate and base plate. Lens plate and base plate are then pressed against the frame of the concentrator module until they touch the spacer. In addition, it is also possible to delimit the spacing between lens plate and base plate during the process of pressing together lens plate and base plate with the frame by the elasticity of the butyl cord or of the corresponding adhesive compound. Lens plate and base plate are hereby pressed against the frame with a force until the force exerted by the butyl cord on lens plate and base plate is equal to the application pressure force.

The pressing-on can take place by means of exerting force from outside but it is also possible to press the lens plate and the base plate against the frame in that a vacuum is generated in the interior of the concentrator module, i.e. in the region between lens plate and base plate which is surrounded by the frame. Lens plate and base plate are then suctioned thus against the frame.

The described invention has the following advantages relative to the state of the art:

- The claimed invention makes it possible to specify exactly the spacing between lens plate and base plate so that the best possible illumination of the solar cell surface is achieved.
- The claimed photovoltaic concentrator module can be produced economically and flexibly. In contrast to the glass frames or screwed-on metal profiles, known from the state of the art, the frame can be readily adapted to any possible requirements.
- The module is air- and/or moisture-impermeable and maintains this property over a significantly longer period of time than concentrator modules known according to the state of the art.
- The frame of the concentrator module can consist of hollow profiles entirely or partially which can receive sorption agents, as a result of which air located in the module and air flowing into the module can be dried.
- Openings can be accommodated in the frame of the module without great complexity and of any shape. The openings can contain for example filters.

The claimed concentrator module can consequently be ventilated in a controlled manner. Dried air can be conducted into the interior or moist air can be suctioned out of the interior.

The claimed concentrator module makes it possible to integrate in the frame electrical leadthroughs between the inside of the concentrator module and the outside in an air- and/or moisture-impermeable manner.

A large number of the claimed concentrator modules can be connected to each other via connection units so that for example a plurality of concentrator modules can be provided together with externally dried air.

BRIEF DESCRIPTION OF THE DRAWING

A few examples of concentrator modules according to the invention are now provided in the following. The same and similar reference numbers are thereby used for the same and similar elements.

FIG. 1 shows the part of a section through a concentrator module according to the invention.

FIG. 2 shows the part of a section through a concentrator module according to the invention, having a frame which comprises a hollow profile filled with sorption agent over the entire width.

FIG. 3 shows the part of a section through a concentrator module according to the invention, having a frame which contains two hollow profiles separated by a spacer frame.

FIG. 4 shows the part of a section through a concentrator module according to the invention like FIG. 2, filters being integrated in the hollow profile.

FIG. 5 shows the part of a section through a concentrator module according to the invention, having a frame on which a mounting is fitted and in which a filter and an electrical leadthrough are integrated.

FIG. 6 shows the part of a section through a concentrator module according to the invention, having a frame in which an electrical leadthrough is integrated.

FIG. 7 shows a part of a side view of a concentrator module according to the invention with a cable leadthrough which has an oval edge.

FIG. 8 shows the part of a section through a concentrator module according to the invention, the frame of which contains a plurality of hollow profiles and also an electrical leadthrough.

FIG. 9 shows the part of a section through a concentrator module according to the invention, in the frame of which a mounting is integrated for suspending the module.

FIG. 10 shows the part of a section through two concentrator modules according to the invention which are connected to each other via a connection unit.

FIG. 11 shows the plan view on a concentrator module according to the invention, the lens plate and/or base plate of which comprises a plurality of partial plates.

FIG. 12 shows a spacer between one part of the lens plate and one part of the base plate.

DETAILED DESCRIPTION OF THE INVENTION

FIG. 1 shows the part of a section through a concentrator module according to the present invention. A transparent lens plate 1 which carries the focusing lenses 7a, 7b and 7c and is parallel to the optical plane of the lenses 7a, 7b and 7c is situated parallel to a base plate 2 which carries the solar cells 8a, 8b and 8c. Between the lens plate 1 and the base plate 2, a frame 3 is disposed along the edge of lens plate 1 and base plate 2, said frame covering the entire spacing between the lens plate 1 and the base plate 2. In the shown example, the cross-section of the frame 3 describes a U-shape, a short member 3a and 3b respectively being orientated towards the lens plate 1 or base plate and a long side 3c extending between lens plate 1 and base plate 2. The corners of the frame 3d and 3e are bevelled over a short piece in the illustrated example so that the long side 3c of the frame 3 does not span the entire spacing between lens plate 1 and base plate 2 but leaves a small space for respectively an outer sealing compound 5a and 5b.

The contact points between the lens plate 1 and the frame 3 and also between the base plate 2 and the frame 3 are sealed by respectively two sealing compounds 4a and 4b and also 5a and 5b. The sealing compounds 4a and 4b can be replaced according to the invention also by adhesive compounds 4a and 4b.

The sealing or adhesive compounds 4a and 4b and also the sealing compounds 5a and 5b are disposed parallel to each other between the edge 3a of the frame 3, orientated towards the lens plate 1, and lens plate 1, and also between the edge 3b of the frame 3, orientated towards the base plate 2, and the base plate 2, in the plane of the lens plate 1 or of the base plate 2 and extend parallel to the frame 3 over its entire length. As outer sealing compounds 5a and 5b, for example elastic silicone can be used, butyl cords for example are suitable as inner sealing compounds 4a and 4b. If, instead of the sealing compounds 4a and 4b, adhesive compounds 4a and 4b are located between the frame and the corresponding plate, then hot-melt adhesive or UV-hardening adhesive for example are suitable here.

In the example illustrated here, the sealing compounds or adhesive compounds 4a and 4b and also the sealing compounds 5a and 5b extend over the entire depth of the frame 3, i.e. its entire extension in the direction of the interior 6 of the module. The sealing or adhesive compounds 4a and 4b are thereby situated towards the interior 6 whilst the sealing compounds 5a and 5b to the outside fill the remaining space between the frame 3 and the lens plate 1 or the base plate 2 which is not filled by the inner sealing or adhesive compounds 4a and 4b.

The solar cells 8a, 8b and 8c are situated in the focus of the lenses 7a, 7b or 7c which are disposed adjacently on the lens plate 1 in such a manner that they cover the surface of the lens plate 1 preferably as completely as possible. For example, the lenses 7a, 7b and 7c can be rectangular and of the same surface area so that they can be disposed adjacently in such a manner that the surface of the lens plate is covered without a gap. Each lens 7a, 7b and 7c focuses the light 18a, 18b or 18c on respectively one solar cell 8a, 8b or 8c.

FIG. 2 shows the part of a section through a concentrator module analogously to FIG. 1 with the difference that here the frame 3 consists of, on its entire width, a hollow profile 10 which is filled with one or more sorption agents 11. The hollow profile 10 can, as long as it meets the described requirements, be of any shape. The hollow profile 10 shown in FIG. 2 has for example a rectangular cross-section, the two corners of the cross-section situated towards the exterior being bevelled so that both the inwardly- 10i and the outwardly-directed side 10a of the hollow profile 10 are situated vertically on lens plate 1 and base plate 2 but the outside 10a of the hollow profile 10 is somewhat shorter than the inside 10i. The sides of the hollow profile 10 which are orientated in the direction of the lens plate 1 and the base plate 2 are bevelled in this example on a part of their length parallel to the lens plate 1 or base plate 2 and over the remainder of the spacing between inside 10i and outside 10a of the hollow profile 10.

The connection places of the hollow profile 10 to the lens plate 1 and the base plate 2 are sealed respectively, as in FIG. 1, with two sealing or adhesive compounds 4a and 4b and also sealing compounds 5a and 5b which extend along the length of the frame. In the example shown here, the sealing or adhesive compounds 4a and 4b and also 5a and 5b extend over the entire depth of the hollow profile 10, i.e. its entire extension in the direction of the interior 6 of the module. The sealing or adhesive compounds 4a and 4b, for example butyl cords in the case of sealing compounds or hot-melt adhesive or UV adhesive in the case of adhesive compounds, are thereby situated towards the interior 6, whilst the sealing compounds 5a and 5b, for example elastic silicone, fill the remaining space between the hollow profile 10 and the lens plate 1 or base plate 2 which is not filled by the butyl cords or the adhesive compounds.

FIG. 3 shows the part of a section through a concentrator module, the frame 3 of which has two hollow profiles 10o and 10u filled with sorption agents 11, one 10o of which abuts against the lens plate 1 and one 10u of which abuts against the base plate 2, and between which a spacer frame 12 constructs the frame 3 on its remaining width. The connection points between the hollow profiles 10o and 10u and the spacer frame 12 and also between the hollow profiles 10o and 10u and also the lens plate 1 or the base plate 2 are hereby sealed respectively by two sealing compounds 4a and 4b or adhesive compounds 4a and 4b and also sealing compounds 5a and 5b which extend parallel to the length of the frame 3 as two sealing lines. In the illustrated example, the cross-section of the hollow profiles 10o and 10u has the shape described for the preceding Figures but the side directed inwards and the one directed outwards is significantly shorter. The cross-section of the spacer frame 12 in the illustrated example has a U-shape, the two members of the U being directed inwards. The other elements shown correspond to those of the preceding Figures.

FIG. 4 shows the part of a section through a concentrator module, the frame 3 of which, over the full width, comprises a hollow profile 10 filled with sorption agent 11, in the outside 10a and inside 10i of which respectively a filter 9a or 9b is integrated so that air can flow past the sorption agent 11 into the interior 6 of the concentrator module or out of the concentrator module. One of the filters 9a in this Figure is situated closer to the lens plate 1, whilst the other filter 9b is situated closer to the base plate 2 so that the gas which flows through the hollow profile 10 covers as wide a path as possible in the sorption agent 11. The filters 9a and 9b can furthermore be disposed also offset along the length of the frame 3 so that the path of the gas through the sorption agent 11 is further extended. The other shown elements correspond to those of the preceding Figures.

FIG. 5 shows a section from a concentrator module, on the frame 3 of which a mounting 13 is mounted for example in order to mount the concentrator module on a tracker. The mounting 13 can be for example a welded-on screw connection. Furthermore, the frame 3 illustrated here has an opening in the broad side which is filled completely by a filter 9. There is termed broad side of the frame that side of the frame which stands perpendicular to the plane of the lens plate 1 and of the base plate 2. Through the filter 9, gas can be conducted or flow directly from the exterior into the interior 6 of the concentrator module without passing through a sorption agent 11.

In addition, FIG. 5 shows an electrical leadthrough 14, which is accommodated in the broad side of the frame, between the interior 6 of the module and the exterior, which is connected via an electrical connection 15 to the solar cells 8a, 8b and 8c which are wired on the base plate 2. This leadthrough 14 can be configured for example as described in WO 03/028114. The other shown elements correspond to those of the preceding Figures.

FIG. 6 shows the part of a section through a concentrator module according to the invention, in the frame of which an electrical leadthrough 14 is incorporated. The electrical leadthrough 14 is incorporated here in a concavity 200 in the frame 3. The space of the concavity 200 which is not filled by the leadthrough 14 is filled here with a sealing compound 201, for example silicone, so that the connection points between frame 3 and leadthrough 14 are sealed. The leadthrough 14 has in addition a plastic material bush 202 which protrudes into the interior of the module 6. Such a leadthrough 14 is distinguished by simple, rapid assembly and also low costs and can serve at the same time for strain relief. Furthermore, the frame 3 in FIG. 6 is not accommodated completely between the lens plate 1 and the base plate 2 but engages around the base plate 2 so that the latter is supported on a part 101 of the frame 3. Between the base plate 2 and the frame 3, a sealing compound 4b for sealing the module is accommodated along the support surface. In addition, FIG. 6 shows a sealing compound 5b between the edge of the base plate 111 and the frame 3. The other illustrated components correspond to those of the preceding Figures.

FIG. 7 shows a part of the side view of a concentrator module according to the invention with a view on the surface of the frame 3. The cable leadthrough 14 can be seen here in the direction of the leadthrough channel 203 thereof which extends through the plastic material bush shown in FIG. 6. Next to the leadthrough 14, a sliding block without a hole boring 204 is disposed on the right and on the left a sliding block with a hole boring 205. The sliding block with hole boring 205 is pushed over a connection cable 206 for connection of the solar module and then serves for guiding and/or strain relief of the cable 206. The two sliding blocks 204 and 205 are pushed into the convexity 200 of the frame 3 so that the region of the convexity 200 which surrounds the leadthrough 14 can be filled with sealing compound 201 without running into other regions of the convexity 200.

FIG. 8 shows the part of a section through a concentrator module according to the invention, the frame 3 of which contains a plurality of hollow profiles 10a, 10b, 10c and 10d. The hollow profiles 10a, 10b, 10c and 10d are thereby disposed adjacently such that they form the frame 3 at the same spacing between lens plate 1 and base plate 2. Furthermore, FIG. 8 shows an electrical leadthrough 14 through a hollow profile 10d. It is configured here as a channel with a plastic material bush 202 which leads through the hollow profile 10d in such a manner that the interior of the hollow profile 10d is open neither to the exterior nor to the interior 6 but a connection between interior 6 and exterior is produced. The other illustrated components correspond to those of the preceding Figures.

FIG. 9 shows the part of a section through a concentrator module according to the invention, in the frame 3 of which a mounting 13 is integrated. The retaining element 13 hereby sits in a convexity 102 with a rectangular cross-section of the frame 3 in such a manner that the concentrator module can be suspended on the mounting 13. The convexity 102 on the edge which is orientated outwards towards the lens plate 1 has a projection 103 for this purpose in the plane of the frame outside, which projection presses against a corner 104 in the mounting 13 which engages in the convexity 102, whilst at the same time the edge 105 of the convexity 102 which is orientated outwards towards the base plate presses against the mounting 13 by the weight of the concentrator module. The other illustrated components correspond to those in the preceding Figures.

FIG. 10 shows parts of a section through two concentrator modules which are connected to each other via a connection element. The connection element is a plug-in connection comprising a plug 17 and a socket 16. Plug 17 and socket 16 can be inserted into the corresponding module, be welded on it or connected to it in another manner. The plug 17 of the one module is inserted into the socket 16 of the other module and the contact point between plug 17 and socket 16 is sealed by a sealing compound 19 which extends along at the contact point in the plane perpendicular to the connection axis. The plug-in connection comprising plug 17 and socket 16 can be gas-permeable according to the invention so that gas can be conducted from one module into the other. Each module can have a plurality of plugs 17 and/or sockets 16 via which it can be connected to a plurality of other modules so that for example externally dried air can be conducted actively through a plurality of concentrator modules. The other illustrated elements correspond to those of the preceding Figures.

FIG. 11 shows the plan view on a concentrator module according to the invention, the lens plate 1 and/or base plate 2 of which consists of a plurality of partial plates 106a to 106e. The partial plates here have a rectangular configuration and are disposed adjacently in parallel along the longitudinal side thereof. However other forms are also possible. Between the partial plates 106a to 106e, boundary regions 107a to 107d are produced.

FIG. 12 finally shows a spacer 108 in the manner in which it can be fitted in the interior 6 of the concentrator module between lens plate 1 and base plate 2. The illustration does not show the longitudinal extension of the spacer 108. Preferably, it follows the longitudinal course of the boundary region 107. A spacer 108 as shown can be disposed under each boundary region 107 along the entire length thereof or along a part of its length. In illustration 12, it can be detected in addition how a first sealing compound 109 fills the boundary region 107 and two second sealing compounds or adhesive compounds 110 extend along the contact surface of lens plate 1 and spacer 108 and also of base plate 2 and spacer 108 on both sides of the boundary region 107 parallel to the length thereof.

The invention claimed is:

1. A photovoltaic concentrator module, comprising:
    a lens plate,
    a base plate,
    a frame connecting the lens plate and the base plate and being disposed circumferentially along respective edges of the lens plate and the base plate such that the lens plate and the base plate are spaced apart and define an interior volume therebetween,
    a plurality of solar cells disposed on the base plate within the interior volume, and
    at least one first compound and at least one second compound disposed along at least a part of a length of the frame and disposed circumferentially between both of: (i) the lens plate and the frame, and (ii) the base plate and the frame,
    wherein at least one first compound is a sealing compound, an adhesive compound, or both a sealing compound and an adhesive compound, the second compound is a sealing compound, and the first and second compounds differ with respect to their respective hardening times and/or gas permeabilities, and
    wherein the frame has over at least part of its length at least two hollow profiles which extend at least partially along the frame and at least one spacer frame which extends along, and parallel to, hollow profiles, and extends over a region of the frame which is not occupied by the at least two hollow profiles.

2. The photovoltaic concentrator module according to claim 1, wherein the frame is disposed between the lens plate and the base plate.

3. The photovoltaic concentrator module according to claim 1, wherein the frame engages around the edge of the lens plate and/or of the base plate.

4. The photovoltaic concentrator module according to claim 1, wherein the at least one first compound and the at least one second compound are disposed parallel to a plane of the lens plate or to a plane of the base plate and to each other circumferentially along the frame.

5. The photovoltaic concentrator module according to claim 1, wherein the at least one second compound is disposed between at least one of: the edge of the lens plate and the frame, and the edge of the base plate and the frame.

6. The photovoltaic concentrator module according to claim 1, wherein at least one of the first and second compounds is permanently elastic.

7. The photovoltaic concentrator module according to claim 1, wherein at least one of the first and second compounds comprises butyl cord.

8. The photovoltaic concentrator module according to claim 1, wherein at least one of the first and second compounds comprises elastic silicone.

9. The photovoltaic concentrator module according to claim 1, wherein the first and second compounds extend beside each other along the frame between the lens plate and the frame, and between the base plate and the frame.

10. The photovoltaic concentrator module according to claim 9, wherein one of the first and second compounds is an inner compound closest to the internal volume of the module, the other of the first and second compounds is an outer compound further from the internal volume of the module, the inner compound is butyl cord and the outer compound is elastic silicone.

11. The photovoltaic concentrator module according to claim 9, wherein one of the first and second compounds is an inner compound closest to the internal volume of the module, the other of the first and second compounds is an outer compound further from the internal volume of the module, the inner compound is elastic silicone and the outer compound is butyl cord.

12. The photovoltaic concentrator module according to claim 1, wherein the at least first compound, as an adhesive compound, extends along at least a part of the length of the frame next to the second compound, which extends on an entire length of the frame, such first and second compounds being disposed between the lens plate and the frame and between the base plate and the frame.

13. The photovoltaic concentrator module according to claim 1, wherein the at least one first compound is accommodated closer towards the interior volume of the concentrator module and next to the at least one second compound.

14. The photovoltaic concentrator module according to claim 1, wherein the at least one first compound comprises at least one of hot-melt adhesive and UV-hardening adhesive.

15. The photovoltaic concentrator module according to claim 1, wherein the frame contains at least one of steel, zinc-plated steel, stainless steel, aluminium, other metals, composite materials, Plexiglass, PMMA, acrylic glass, other plastic materials, and glass.

16. The photovoltaic concentrator module according to claim 1, wherein at least one of the at least two hollow profiles comprises at least one of steel, zinc-plated steel, stainless steel, aluminium, other metals, composite materials, Plexiglass, PMMA, acrylic glass, other plastic materials, and glass.

17. The photovoltaic concentrator module according to claim 1, wherein at least one of the at least two hollow profiles has holes towards the interior volume of the module.

18. The photovoltaic concentrator module according to claim 1, wherein at least one of the at least two hollow profiles is filled completely or partially with a sorption agent.

19. The photovoltaic concentrator module according to claim 18, wherein the sorption agent comprises at least one of silica gel, $SiO_2$, calcium chloride, calcium oxide, magnesium sulphate, and calcinated alumina.

20. The photovoltaic concentrator module according to claim 1, wherein at least one of the at least two hollow profiles extends along an entire length of the frame.

21. The photovoltaic concentrator module according to claim 1, wherein the at least one first compound is disposed along connection lines between at least one of the at least two hollow profiles and the at least one spacer frame, and is disposed over a part of the length thereof or the entire length thereof.

22. The photovoltaic concentrator module according to claim 21, wherein at least one of the first and second compounds comprises butyl cord.

23. The photovoltaic concentrator module according to claim 21, wherein at least one of the first and second compounds comprises elastic silicone.

24. The photovoltaic concentrator module according to claim 21, wherein the at least two hollow profiles are connected to the at least one spacer frame via the first and second compounds along each connection line, one of the first and second compounds is an inner compound closest to the internal volume of the module, the other of the first and second compounds is an outer compound further from the internal volume of the module, the inner compound being butyl cord and the outer compound being elastic silicone.

25. The photovoltaic concentrator module according to claim 1, wherein the at least two hollow profiles are connected to the at least one spacer frame along each connection line via the first and second compounds, one of the first and second compounds is an inner compound closest to the internal volume of the module, the other of the first and second compounds is an outer compound further from the internal volume of the module, the outer compound is a sealing compound, and the inner compound is an adhesive compound which extends internally over at least a part of the length of the connection line.

26. The photovoltaic concentrator module according to claim 21, wherein at least one of the first and second compounds comprises at least one of hot-melt adhesive and UV-hardening adhesive.

27. The photovoltaic concentrator module according to claim 1, wherein at least one of the frame, a wall of at least one of the at least two hollow profiles, and at least one spacer frame has at least one opening with at least one filter.

28. The photovoltaic concentrator module according to claim 27, wherein at least one of the at least one filters comprises at least one of sintered metal, a metal grating, a plastic material net, and a plastic material membrane.

29. The photovoltaic concentrator module according to claim 27, wherein at least one of the filters, an inner filter, is situated in an opening towards the interior volume and at least one of the filters, and outer filter, is situated in an opening towards an exterior of at least one of the at least two hollow profiles.

30. The photovoltaic concentrator module according to claim 29, wherein the outer filter is a coarse filter and the inner filter is a fine filter.

31. The photovoltaic concentrator module according to claim 30, wherein at least one of the coarse filter excludes particles larger than 50 µm, and the fine filter excludes particles larger than 5 µm.

32. The photovoltaic concentrator module according to claim 1, wherein at least a part of the module is adapted to be heated.

33. The photovoltaic concentrator module according to claim 1, wherein at least one of the at least two hollow profiles, at least one spacer frame, at least one of the at least one first compounds, and at least one of the at least one second compounds is adapted to be heated.

34. The photovoltaic concentrator module according to claim 1, wherein the frame is at least partially light-absorbing.

35. The photovoltaic concentrator module according to claim 1, wherein at least one of the at least two hollow profiles, at least one spacer frame, at least one of the at least one first compounds, at and least one of the at least one second compounds is at least partially light-absorbing.

36. The photovoltaic concentrator module according to claim 1, wherein the frame has a mounting.

37. The photovoltaic concentrator module according claim 36, wherein the mounting is for mounting and adjusting the photovoltaic concentrator module on a tracker.

38. The photovoltaic concentrator module according to claim 36, wherein the mounting comprises a screw connection.

39. The photovoltaic concentrator module according to claim 36, wherein the mounting is an earth contact for the photovoltaic concentrator module.

40. The photovoltaic concentrator module according to claim 1, wherein the frame has at least one electrical connection between the interior volume of the photovoltaic concentrator module and an exterior thereof.

41. The photovoltaic concentrator module according to claim 40, wherein the at least one electrical connection between the interior volume of the photovoltaic concentrator module and the exterior is at least one or moisture-impermeable and gas-impermeable.

42. The photovoltaic concentrator module according to claim 1, wherein the frame has at least one connection element for mechanical connection of the photovoltaic concentrator module to other modules.

43. The photovoltaic concentrator module according to claim 42, wherein at least one of the at least one connection elements is a plug-in connection element which is accommodated in at least one opening in the frame, in at least one opening in at least one spacer frame, and in at least one opening in at least of one of the at least two hollow profiles.

44. The photovoltaic concentrator module according to claim 42, wherein at least one of the at least one connection elements is adapted to conduct gas therethrough.

45. The photovoltaic concentrator module according to claim 42, wherein the photovoltaic concentrator module is adapted to be connected via the at least one connection element to a plant for active introduction of gas.

46. The photovoltaic concentrator module according to claim 1, wherein the interior volume of the module has at least one spacer between the lens plate and the base plate.

47. The photovoltaic concentrator module according to claim 1, wherein at least one of the lens plate and the base plate has at least two partial plates which are disposed beside one another in a plane of one of the lens plate and the base plate.

48. The photovoltaic concentrator module according to claim 47, wherein at least one spacer is disposed along at least a part of at least one boundary region between the lens plate and the base plate, such that the at least one spacer covers the boundary region, and the boundary region being configured between the edges of adjacent partial plates.

49. The photovoltaic concentrator module according to claim 48, wherein a cross-section of the at least one spacer has a double-T shape in a plane perpendicular to a longitudinal direction of the boundary region, and the two parallel portions of the double-T being situated parallel to the lens plate and to the base plate such that they cover the boundary region.

50. The photovoltaic concentrator module according to claim 48, wherein the boundary region is filled at least over a part of its length with at least one filling compound.

51. The photovoltaic concentrator module according to claim 48, wherein at least one of: between the at least one spacer and the lens plate and between the at least one spacer and the base plate, a sealing compound and/or an adhesive compound is disposed along at least a part of the length of at least one boundary region on both sides of the boundary region.

52. The photovoltaic concentrator module according to claim 50, wherein at least one of:
the at least one filling compound comprises of elastic silicone,
the at least one sealing compound comprises butyl cord, and
the at least one adhesive compound comprises at least one of hot-melt adhesive and UV-hardening adhesive.

53. The photovoltaic concentrator module according to claim 46, wherein the at least one spacer has at least one component for conducting therethrough at least one of gas and at least one electrical leadthrough.

54. A method for the production of a photovoltaic concentrator module, comprising:
disposing a plurality of solar cells a base plate,
disposing a frame, for connecting a lens plate and the base plate, along an edge of the lens plate and along an edge of the base plate, and
introducing at least one first compound and at least one second compound along at least a part of a length of the frame and disposed circumferentially between both of: (i) the lens plate and the frame, and (ii) the base plate and the frame,
wherein the first compound is a sealing compound, an adhesive compound, or both a sealing compound and an adhesive compound, the second compound is a sealing compound, and the first and second compounds differ with respect to their hardening times and/or gas permeabilities, and
wherein the frame has over at least part of its length at least two hollow profiles which extend at least partially along the frame and at least one spacer frame which extends along, and parallel to, hollow profiles, and extends over a region of the frame which is not occupied by the at least two hollow profiles.

55. The method according to claim 54, further comprising gluing the frame to at least one of the lens plate and the base plate.

56. The method according to claim 54, further comprising pressing the frame, the lens plate and the base plate together in such a manner that a spacing between the lens plate and the base plate is maintained with a tolerance of one of: (i) less than 1 mm, and (ii) less than 500 μm.

57. The method according to claim 54, further comprising pre-fixing the lens plate and the base plate and the frame by means of at least one of hot-melt adhesive, UV-hardening adhesive, and thermoplastic adhesive to a tolerance of one of: (i) less than 1 mm, and (ii) less than 500 μm.

58. The method according to claim 54, further comprising:
fixing the lens plate and the base plate to the frame via a quick-hardening adhesive compound, and
subsequently sealing the lens plate and the base plate to the frame with a sealing compound.

* * * * *